US010275047B2

(12) United States Patent
Li et al.

(10) Patent No.: US 10,275,047 B2
(45) Date of Patent: Apr. 30, 2019

(54) DETERMINING STYLUS LOCATION RELATIVE TO PROJECTED WHITEBOARD USING SECONDARY IR EMITTER ON STYLUS

(71) Applicant: Lenovo (Singapore) Pte. Ltd., New Tech Park (SG)

(72) Inventors: Scott Wentao Li, Cary, NC (US); Stephen Paul Floyd, Raleigh, NC (US); Brian Keith Hardbarger, Durham, NC (US); Jennifer Jyi Shue, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 214 days.

(21) Appl. No.: 15/251,223

(22) Filed: Aug. 30, 2016

(65) Prior Publication Data

US 2018/0059816 A1 Mar. 1, 2018

(51) Int. Cl.
*G06F 3/0354* (2013.01)
*H03H 11/24* (2006.01)
*G06F 3/03* (2006.01)
*G06F 3/0346* (2013.01)
*G06F 3/038* (2013.01)

(52) U.S. Cl.
CPC ........ *G06F 3/03542* (2013.01); *G06F 3/0325* (2013.01); *G06F 3/0346* (2013.01); *G06F 3/0386* (2013.01); *H03H 11/245* (2013.01)

(58) Field of Classification Search
CPC .. G06F 3/03542; G06F 3/0325; G06F 3/0346; G06F 3/0386

USPC ........................................................ 345/179
See application file for complete search history.

(56) References Cited

U.S. PATENT DOCUMENTS

| 7,390,092 | B2 | 6/2008 | Belliveau |
| 8,711,225 | B2 | 4/2014 | Chang et al. |
| 2001/0030668 | A1 | 10/2001 | Erten et al. |
| 2003/0071754 | A1* | 4/2003 | McEwan ................... G01S 5/06 342/464 |

(Continued)

OTHER PUBLICATIONS

Scott Wentao Li, Bruce Douglas Gress, Shayesteh Kamrani Sims, David Williams Higgins, "Calibration of Pen Location to Projected Whiteboard", file history of related U.S. Appl. No. 15/248,418 filed Aug. 26, 2016.

(Continued)

*Primary Examiner* — Amare Mengistu
*Assistant Examiner* — Gloryvid Figueroa-Gibson
(74) *Attorney, Agent, or Firm* — John L. Rogitz; John M. Rogitz (57) ABSTRACT

In one aspect, a device includes a processor, an infrared (IR) detector accessible to the processor and that receives signals from a primary IR emitter on a hand-held device and a secondary IR emitter on the hand-held device, a projector accessible to the processor, a transceiver accessible to the processor, and storage accessible to the processor. The storage bears instructions executable by the processor to use a location of the secondary IR emitter as sensed by the IR detector and orientation data of the hand-held device received from the transceiver to extrapolate a handwriting projection reference. The instructions are also executable to use the handwriting projection reference to project handwriting onto a projected whiteboard.

18 Claims, 4 Drawing Sheets

(56) References Cited

U.S. PATENT DOCUMENTS

| | | |
|---|---|---|
| 2003/0122780 A1 | 7/2003 | Hendriks et al. |
| 2005/0270494 A1 | 12/2005 | Banning |
| 2009/0309853 A1 | 12/2009 | Hildebrandt et al. |
| 2009/0315829 A1* | 12/2009 | Maison ............... G06F 3/03545 345/158 |
| 2011/0164000 A1* | 7/2011 | Pance ................ G06F 3/03545 345/179 |
| 2011/0169778 A1 | 7/2011 | Nungester et al. |
| 2012/0044140 A1* | 2/2012 | Koyama ............... G06F 3/0325 345/157 |
| 2012/0212415 A1 | 8/2012 | Yokobayashi |
| 2013/0135260 A1 | 5/2013 | Damhaug et al. |
| 2013/0258116 A1 | 10/2013 | Chang et al. |
| 2013/0298029 A1 | 11/2013 | Natori et al. |
| 2014/0062863 A1 | 3/2014 | Yu et al. |
| 2014/0168367 A1 | 6/2014 | Kang |
| 2015/0094564 A1* | 4/2015 | Tashman ................ A61B 6/505 600/424 |
| 2016/0378258 A1 | 12/2016 | Lyons et al. |
| 2018/0059816 A1 | 3/2018 | Li et al. |

OTHER PUBLICATIONS

Scott Wentao Li, Bruce Douglas Gress, Shayesteh Kamrani Sims, David Williams Higgins, "Calibration of Pen Location to Projected Whiteboard", related U.S. Appl. No. 15/248,418, Applicant's response to Non-Final Office Action dated Mar. 26, 2018.

Scott Wentao Li, Bruce Douglas Gress, Shayesteh Kamrani Sims, David Williams Higgins, "Calibration of Pen Location to Projected Whiteboard", related U.S. Appl. No. 15/248,418, Non-Final Office Action dated Jan. 23, 2018.

Scott Wentao Li, Bruce Douglas Gress, Shayesteh Kamrani Sims, David Williams Higgins, "Calibration of Pen Location to Projected Whiteboard", related U.S. Appl. No. 15/248,418, Non-Final Office Action dated May 31, 2018.

Scott Wentao Li, Bruce Douglas Gress, Shayesteh Kamrani Sims, David Williams Higgins, "Calibration of Pen Location to Projected Whiteboard", related pending U.S. Appl. No. 15/248,418, applicant's response to non-final office action dated Aug. 14, 2018.

* cited by examiner

DETERMINING STYLUS LOCATION RELATIVE TO PROJECTED WHITEBOARD USING SECONDARY IR EMITTER ON STYLUS

FIELD

The present application relates generally to determining the location of a stylus relative to a projected whiteboard using a secondary infrared (IR) emitter on the stylus.

BACKGROUND

As recognized herein, projector assemblies on computerized devices have been used to project a whiteboard onto a surface. A person can ghost write onto the projected whiteboard by moving, in free space, a pen with an infrared (IR) emitter on it. The projector includes an IR detector (the detecting portion of an IR "tracker") so that movement of the pen in free space is tracked by means of its IR emitter, and the movement is correlated to pen strokes which can then be projected onto the whiteboard, as if the person were manually writing on a physical whiteboard.

As understood herein, the IR emitter may from time to time be blocked from the IR tracker by, for instance, the user.

SUMMARY

Accordingly, in one aspect a device includes a processor, an infrared (IR) detector accessible to the processor and that receives signals from a primary IR emitter on a hand-held device and a secondary IR emitter on the hand-held device, a projector accessible to the processor, a transceiver accessible to the processor, and storage accessible to the processor. The storage bears instructions executable by the processor to use a location of the secondary IR emitter as sensed by the IR detector and orientation data of the hand-held device received from the transceiver to extrapolate a handwriting projection reference. The instructions are also executable to use the handwriting projection reference to project handwriting onto a projected whiteboard.

In another aspect, a computer readable storage medium (CRSM) that is not a transitory signal includes instructions executable by a processor to access, from a hand-held device, an orientation signal. The instructions are executable to access from an infrared (IR) detector information indicating a location of a secondary IR emitter on the hand-held device, which also has a primary IR emitter. The instructions are further executable to determine an extrapolated location $L_P$ of the primary emitter as being:

$L_P = L_S + D(f(\theta))$, wherein $L_S$ is the location of the secondary IR emitter, $\theta$ is indicated in the orientation signal, "D" is a distance between the primary and secondary IR emitters, and "f" is a trigonometric function.

In yet another aspect, a method includes detecting, at a device and using an IR detector associated with a projector projecting a whiteboard onto a surface, a secondary infrared (IR) emitter on a stylus, where the stylus also includes a primary IR emitter. The method further includes receiving orientation data pertaining to the stylus and projecting, using the detection of the secondary IR emitter and the orientation data, handwriting onto the whiteboard.

The details of present principles, both as to their structure and operation, can best be understood in reference to the accompanying drawings, in which like reference numerals refer to like parts, and in which:

DETAILED DESCRIPTION

With respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple, Google, or Microsoft. A Unix or similar such as Linux operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware; hence, illustrative components, blocks, modules, circuits, and steps are sometimes set forth in terms of their functionality.

A processor may be any conventional general purpose single- or multi-chip processor that can execute logic by means of various lines such as address lines, data lines, and control lines and registers and shift registers. Moreover, any logical blocks, modules, and circuits described herein can be implemented or performed, in addition to a general purpose processor, in or by a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

Any software and/or applications described by way of flow charts and/or user interfaces herein can include various sub-routines, procedures, etc. It is to be understood that logic divulged as being executed by, e.g., a module can be redistributed to other software modules and/or combined together in a single module and/or made available in a shareable library.

Logic when implemented in software, can be written in an appropriate language such as but not limited to C# or C++, and can be stored on or transmitted through a computer-readable storage medium (e.g., that is not a transitory signal) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Figure 1:
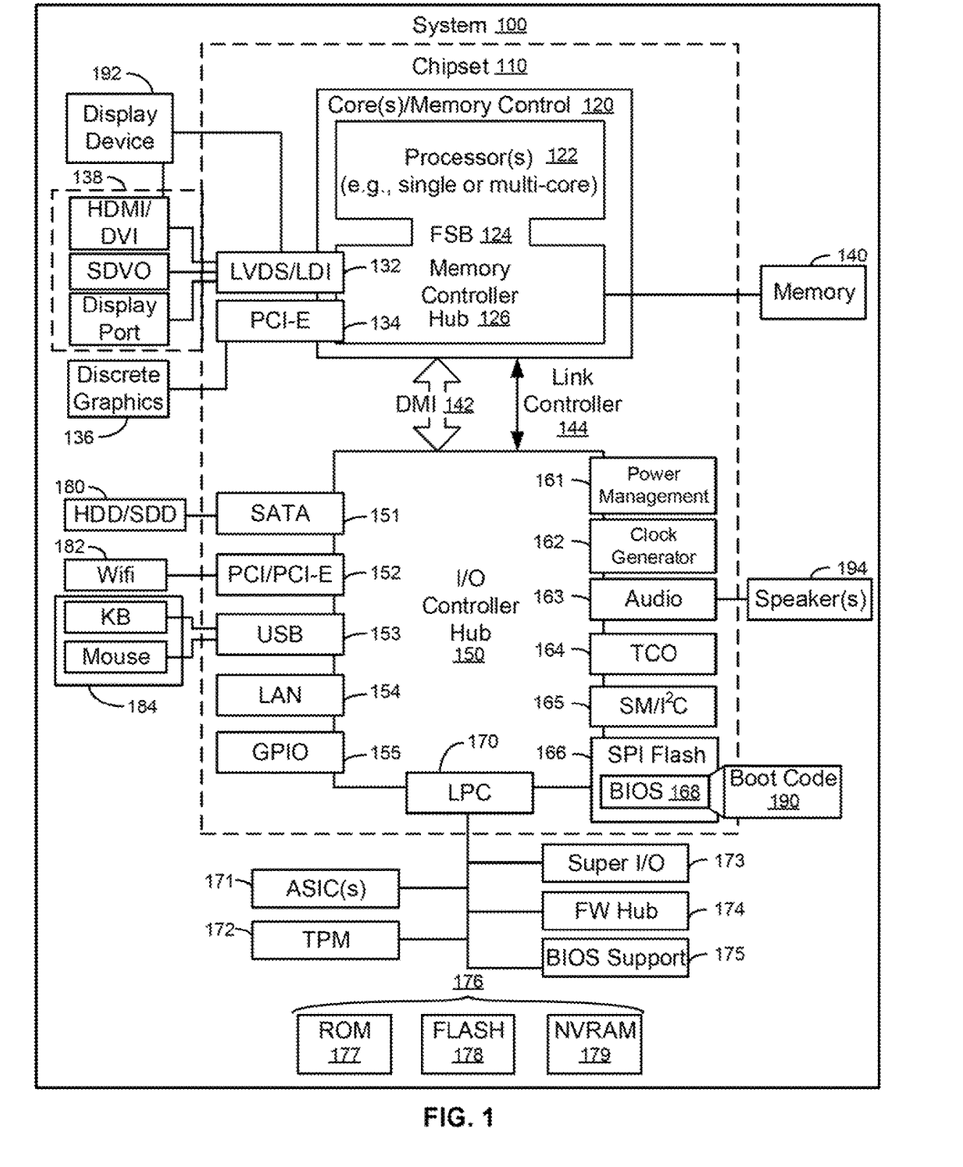
FIG. 1 is a block diagram of an example system in accordance with present principles.

Now specifically in reference to FIG. 1, an example block diagram of an information handling system and/or computer system 100 is shown. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a wireless telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the conventional "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (x16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB) and mice, microphones and various other devices (e.g., cameras including both visible spectrum cameras an infrared cameras such as forward looking infrared (FLIR) cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

Additionally, in some embodiments the system 100 may include a gyroscope that senses and/or measures the orientation of the system 100 and provides input related thereto to the processor 122, an accelerometer that senses acceleration and/or movement of the system 100 and provides input related thereto to the processor 122, an audio receiver/microphone that provides input from the microphone to the processor 122 based on audio that is detected, such as via a user providing audible input to the microphone, and a camera such as mentioned above for the input device 184 that gathers one or more visible and/or IR images and provides input related thereto to the processor 122. The camera may be a thermal imaging camera, an infrared (IR) camera, a digital camera such as a webcam, a three-dimensional (3D) camera, and/or a camera otherwise integrated into the system 100 and controllable by the processor 122 to gather pictures/images and/or video. Still further, the system 100 may include a GPS transceiver that is configured to receive geographic position information from at least one satellite and provide the information to the processor 122. However, it is to be understood that another suitable position receiver other than a GPS receiver may be used in accordance with present principles to determine the location of the system 100.

It is to be understood that an example client device or other machine/computer may include fewer or more features than shown on the system 100 of FIG. 1. In any case, it is to be understood at least based on the foregoing that the system 100 is configured to undertake present principles.

Figure 2:
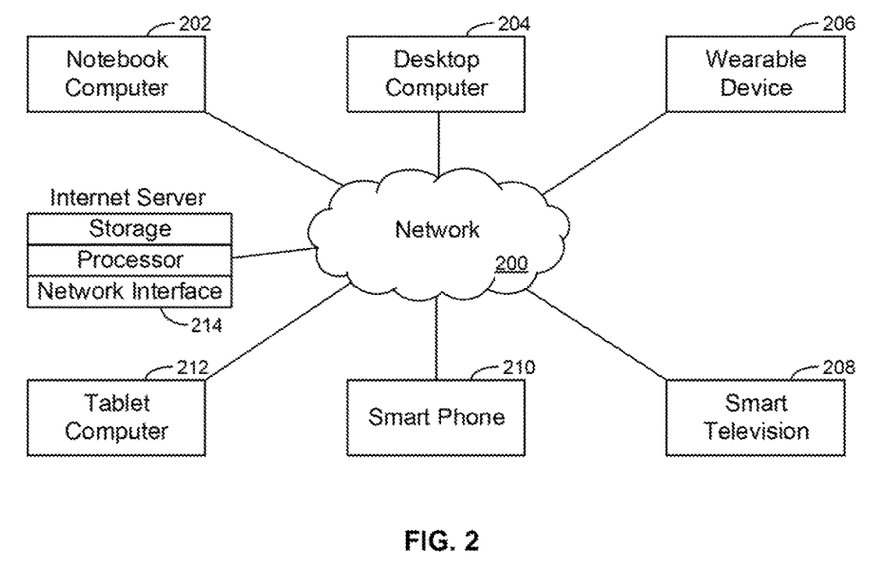
FIG. 2 is an example block diagram of a network of devices in accordance with present principles.

Turning now to FIG. 2, example devices are shown communicating over a network 200 such as the Internet in accordance with present principles. It is to be understood that each of the devices described in reference to FIG. 2 may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, and a server 214 such as an Internet server that may provide cloud storage accessible to the devices 202-212. It is to be understood that the devices 202-214 are configured to communicate with each other over the network 200 to undertake present principles.

Figure 3:
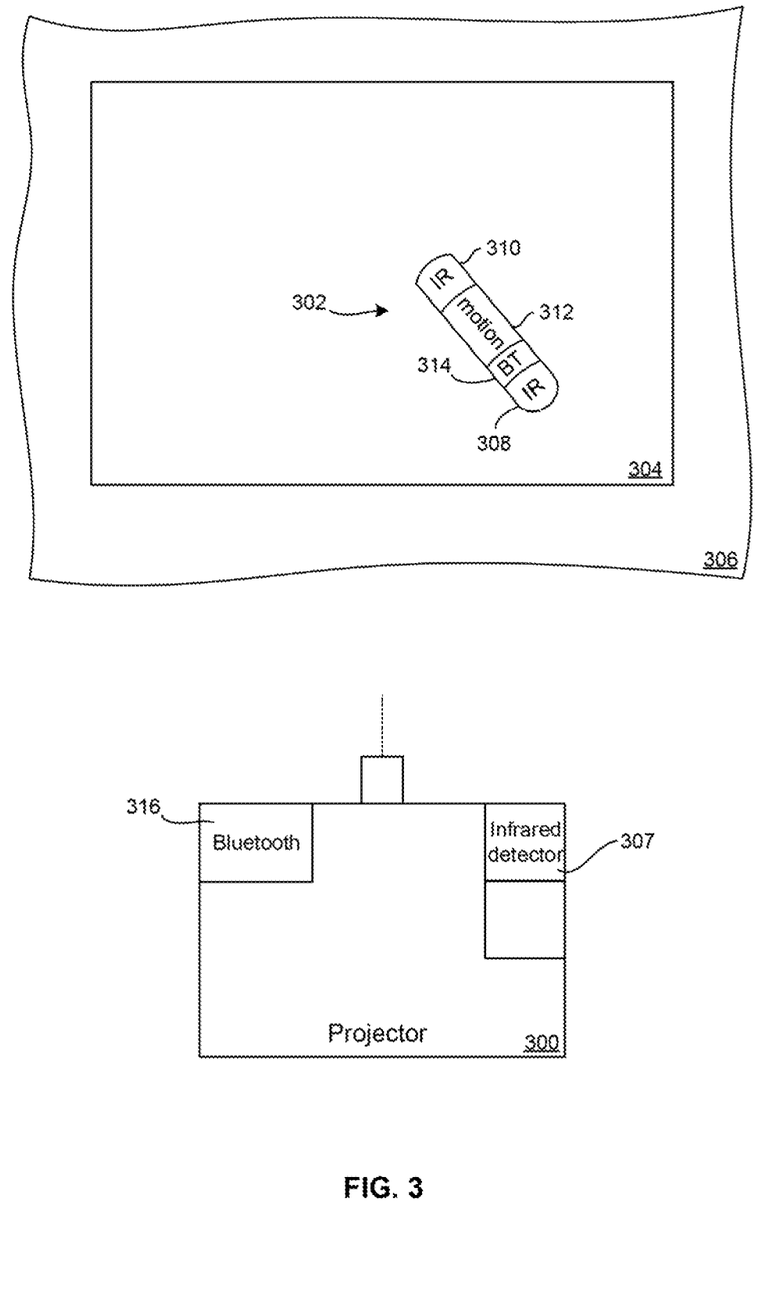
FIG. 3 is a schematic diagram of a projector and a pen for ghostwriting onto a whiteboard projected onto a surface by the projector.

FIG. 3 is a schematic diagram of a projector 300, such as may be implemented by a tablet computer incorporating any of the components discussed above as well as those specifically shown and discussed, and a pen 302, also incorporating any of the components discussed above as well as those specifically shown and discussed. Note that "pen" is used but that this does not mean the pen must contain ink or graphite, only that it is a hand-held device, typically elongated, useful for ghostwriting on a projected whiteboard. "Stylus" is another term that may be used.

In the example shown, the projector 300 projects an image 304 of a whiteboard onto a surface 306. The projector 300 typically includes an infrared (IR) detector 307 such as an IR camera for detecting IR from a primary IR emitter 310 (such as a diode) on the "near" end of the pen 302, i.e., the end opposed to the assumed "writing" end. The pen 302 may also include a secondary IR emitter 310 on the end of the pen opposite the primary emitter 308 or on some other region of the pen. The locations of the primary and secondary emitters may be reversed if desired.

Furthermore, the pen 302 may include an orientation/motion sensor 312 such as gyroscope and/or magnetometer and/or accelerometer. Signals from the sensor 312 may be sent by a transceiver 314 on the pen (such as but not limited to a Bluetooth transceiver) to be received by a complementary transceiver 316 associated with the projector 300.

Figure 4:
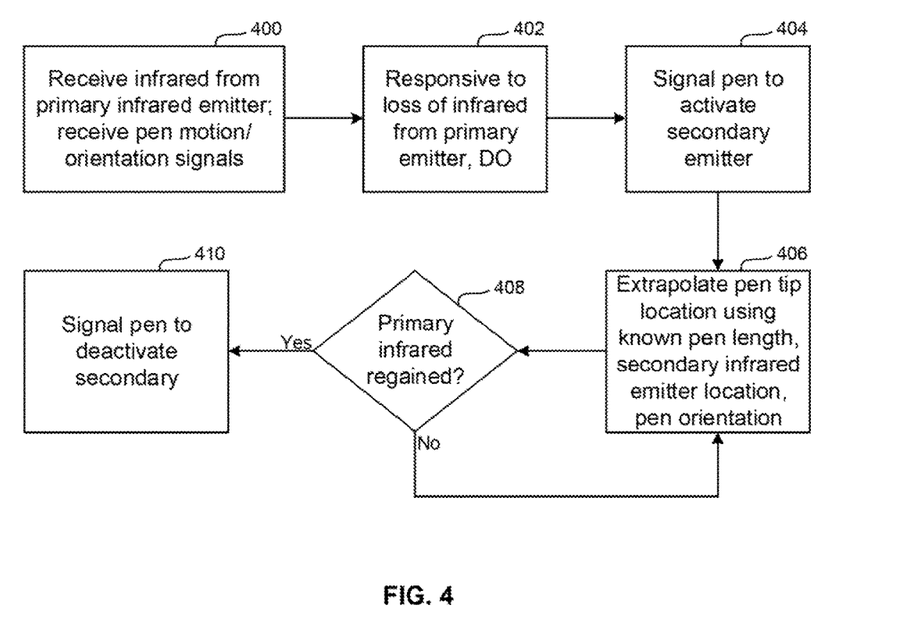
FIG. 4 is a flow chart of example logic.

FIG. 4 illustrates example logic that may be executed by any of the devices above, typically by the projector 300. Commencing at block 400, the IR detector 307 on the projector 300 receives IR from the primary emitter 308 on the pen 302, with the secondary IR emitter being deactivated (deenergized). Signals from the sensor 312 on the pen 302 are also received by the projector 300.

When it is determined by the projector 300 at block 402 that it is no longer receiving IR from the primary emitter 308, at block 404 the projector 300 may send a signal via the transceivers 316, 314 to the pen 302 to activate/energize the secondary IR emitter 310. The pen 302 continues to send to the projector 300, via the transceivers 314, 316, orientation and/or motion data.

Proceeding to block 406, using the distance between the emitters 308, 310, which can be preprogrammed into the projector 300 or sent to the projector 300 by the pen 302, as well as the sensed location of the secondary emitter 310 and the orientation data of the pen, the projector 300 extrapolates pen tip positions. In this way, user ghost writing on the projected whiteboard is still captured when primary IR emitter tracking is lost.

Responsive to a subsequent determination at decision diamond 408 that the primary IR emitter 308 is once again detected by the IR detector 307, the logic moves to block 410 to signal the pen 302 to deactivate the secondary IR emitter 310 and resume tracking the pen using the signal from the primary IR emitter 308. Until the primary IR emitter 308 is re-acquired, the logic at block 406 may continue, in some embodiments for no more than a threshold period, after which, to avoid accumulating inaccuracies, no handwriting may be projected onto the whiteboard until such time as the primary IR emitter 308 is re-acquired by the projector 300.

To illustrate specifics of logic that may be employed at block 406, the location $L_P$ of the primary emitter 308 may be extrapolated as follows:

$L_P = L_S + D(f(\theta))$, wherein $L_S$ is the detected location of the secondary emitter 310 as sensed by the IR detector 307, D is the distance between the emitters 308, 310, $\theta$ is the orientation angle of the pen 302 relative to a reference frame as sensed by the sensor 312 and reported to the projector 300 through the transceivers 314/316, and "f" is an appropriate trigonometric function such as sine or cosine or tangent. Note that "D" may be defaulted to unity.

Once the location $L_P$ of the primary emitter 308 is extrapolated, it may be used by the projector 300 to project handwriting onto the whiteboard 304 as though it were a sensed location of the primary emitter 308.

Moving on from FIG. 4, it is to be understood in accordance with present principles that a user interface (UI) may be presented on a display controlled by a device configured to execute the logic above. The UI may be for configuring settings of such a device, and may include at least a first option that is selectable from the UI to configure the device to undertake present principles (e.g., selectable to configure the device to automatically actuate and use a secondary IR transmitter for pen tracking when a primary IR transmitter on the pen is blocked as set forth herein).

Before concluding, it is to be understood that although a software application for undertaking present principles may be vended with a device such as the system 100, present principles apply in instances where such an application is downloaded from a server to a device over a network such as the Internet. Furthermore, present principles apply in instances where such an application is included on a computer readable storage medium that is being vended and/or provided, where the computer readable storage medium is not a transitory signal and/or a signal per se.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A device, comprising:
   a processor;
   an infrared (IR) detector accessible to the processor and that is configured to receive signals from a primary IR emitter on a hand-held device and a secondary IR emitter on the hand-held device;
   a projector accessible to the processor;
   a transceiver accessible to the processor;
   storage accessible to the processor and bearing instructions executable by the processor to:
   use a location of the secondary IR emitter as sensed by the IR detector and orientation data of the hand-held device received from the transceiver to extrapolate a handwriting projection reference;
   use the handwriting projection reference to project handwriting onto a surface;
   determine that the IR detector does not receive signals from the primary IR emitter on the hand-held device; and
   responsive to determining that the IR detector does not receive signals from the primary IR emitter, transmit a signal to the hand-held device to activate the secondary IR emitter.

2. The device of claim 1, wherein the instructions are executable by the processor to:
   responsive to a determination that IR from the primary IR emitter is re-acquired, send a signal to the hand-held device to deactivate the secondary IR emitter.

3. The device of claim 1, wherein the instructions are executable by the processor to:
   use, to extrapolate the handwriting projection reference, a location of the secondary IR emitter as sensed by the IR detector, a distance between the primary IR emitter and the secondary IR emitter, and orientation data of the hand-held device received from the transceiver.

4. The device of claim 1, wherein the handwriting projection reference is an extrapolated location of the primary IR emitter.

5. The device of claim 1, wherein the orientation data is generated by a sensor on the hand-held device.

6. The device of claim 5, wherein the sensor comprises at least one of the group consisting of: a gyroscope, a magnetometer.

7. The device of claim 1, comprising the hand-held device.

8. A computer readable storage medium (CRSM) that is not a transitory signal, the computer readable storage medium comprising instructions executable by a processor to:
   access, from a hand-held device, an orientation signal;
   access, from an infrared (IR) detector, information indicating a location of a secondary IR emitter on the hand-held device, the hand-held device also having a primary IR emitter;
   determine an extrapolated location LP of the primary emitter as being:
   LP=LS+D(f(angle)), wherein LS is the location of the secondary IR emitter, angle is indicated in the orientation signal, "D" is a distance between the primary and secondary IR emitters, and "f" is a trigonometric function.

9. The CRSM of claim 8, wherein the instructions are executable by the processor to:
   determine that the IR detector does not receive signals from the primary IR emitter; and
   responsive to determining that the IR detector does not receive signals from the primary IR emitter, transmit a signal to the hand-held device to activate the secondary IR emitter.

10. The CRSM of claim 9, wherein the instructions are executable by the processor to:
    responsive to a determination that IR from the primary IR emitter is re-acquired, send a signal to the hand-held device to deactivate the secondary IR emitter.

11. The CRSM of claim 8, wherein the instructions are executable by the processor to:
    use the extrapolated location LP of the primary emitter to project handwriting onto a projected whiteboard.

12. The CRSM of claim 8, wherein the instructions are executable by the processor to:
    use, to extrapolate the handwriting projection reference, a location of the secondary IR emitter as sensed by the IR detector, a distance between the primary IR emitter and the secondary IR emitter, and orientation data of the hand-held device received from a transceiver.

13. The CRSM of claim 8, comprising the processor and the IR detector.

14. A method, comprising:
    detecting, at a device and using an IR detector associated with a projector projecting onto a surface, a secondary infrared (IR) emitter on a stylus, the stylus further comprising a primary IR emitter;
    receiving orientation data pertaining to the stylus;
    projecting, using the detection of the secondary IR emitter and the orientation data, handwriting onto the surface;
    using a location of the secondary IR emitter as sensed by the IR detector, a distance between the primary IR emitter and the secondary IR emitter, and the orientation data, extrapolating a handwriting projection reference.

15. The method of claim 14, comprising:
    determining that the primary IR emitter on the stylus is not detected by the IR detector; and
    providing, responsive to determining that the primary IR emitter is not detected by the IR detector, a command to the stylus for the secondary IR emitter on the stylus to be activated.

16. The method of claim 15, comprising:
responsive to a determination that IR from the primary IR emitter is re-acquired, providing a command to the stylus to deactivate the secondary IR emitter.

17. The method of claim 14, wherein the handwriting projection reference is an extrapolated location of the primary IR emitter.

18. The method of claim 14, wherein using a location of the secondary IR emitter as sensed by the IR detector, a distance between the primary IR emitter and the secondary IR emitter, and the orientation data comprises:
determining an extrapolated location LP of the primary emitter as being:
LP=LS+D(f(angle)), wherein LS is the location of the secondary IR emitter, angle is indicated in the orientation data, "D" is a distance between the primary and secondary IR emitters, and "f" is a trigonometric function.

\* \* \* \* \*